United States Patent
Fattaruso et al.

(10) Patent No.: US 6,388,522 B1
(45) Date of Patent: May 14, 2002

(54) COMMON MODE FEEDBACK BIAS FOR LOW VOLTAGE OPAMPS

(75) Inventors: John W. Fattaruso, Dallas; Daramana G. Gata, Plano, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/932,376

(22) Filed: Aug. 17, 2001

Related U.S. Application Data

(60) Provisional application No. 60/227,227, filed on Aug. 23, 2000.

(51) Int. Cl.[7] .................................................. H03F 3/45
(52) U.S. Cl. ....................................... 330/258; 330/253
(58) Field of Search ............................ 330/253, 258, 330/259, 261, 292

(56) References Cited

U.S. PATENT DOCUMENTS

| | | | | |
|---|---|---|---|---|
| 4,797,631 A | * | 1/1989 | Hsu et al. ................ | 330/253 |
| 6,052,025 A | * | 4/2000 | Chang et al. ............. | 330/253 |
| 6,140,877 A | * | 10/2000 | Forbes ...................... | 330/258 |
| 6,265,941 B1 | * | 7/2001 | Lopata ...................... | 330/258 |

* cited by examiner

*Primary Examiner*—Benny Lee
*Assistant Examiner*—Henry Choe
(74) *Attorney, Agent, or Firm*—Alan K. Stewart; Wade James Brady, III; Frederick J. Telecky, Jr.

(57) ABSTRACT

The opamp with common mode feedback bias includes: a first differential pair M1 and M2 having first and second inputs; active load devices M3 and M4 coupled to the first differential pair M1 and M2; a common mode feedback circuit 20 coupled to the active load devices M3 and M4 for controlling the active load devices M3 and M4; a second differential pair M18 and M19 having a first input coupled to the first input of the first differential pair M1 and M2 and a second input coupled to the second input of the first differential pair M1 and M2; and current drivers M22 and M23 having control nodes coupled to the second differential pair M18 and M19 and outputs coupled to the active load devices M3 and M4.

19 Claims, 3 Drawing Sheets

COMMON MODE FEEDBACK BIAS FOR LOW VOLTAGE OPAMPS

This application claims priority under 35 USC §119 (e)(1) of provisional application No. 60/227,227, filed Aug. 23, 2000.

FIELD OF THE INVENTION

This invention generally relates to electronic systems, and more particularly relates to common mode feedback bias for low voltage opamps.

BACKGROUND OF THE INVENTION

FIG. 1 shows a prior art two stage fully differential opamp for low voltage systems. Differential pair transistors M1 and M2 with active loads transistors M3 and M4 form the first stage, and common source amplifier transistors M5 and M6 with active load transistors M11 and M12 serve as a class-A output stage driving the output terminals OUTP and OUTM. Miller pole-splitting compensation is shown. Common mode feedback is applied with differential pair transistors M7 and M8, loaded with current mirror transistor M9 working into the first stage active load devices M3 and M4. The desired level of output common mode voltage is applied at terminal CMDES, and the actual output common mode level is sensed with a pair of matched averaging resistors R1 and R2. The common mode feedback drives the observed level to the desired level with the loop gain. Small capacitors C1 and C2 bypassing R1 and R2 improve the common mode loop phase margin.

This topology works fairly well, but it is possible that if the opamp is used in a circuit with overall resistive feedback, the common mode loop can settle in a stable operating point which drives both the output terminals to the positive rail. Suppose that in either an initial startup condition or a transient condition both the input terminals INP and INM are close to the positive rail. This will leave the input stage tail current source transistor M13 with virtually no drain voltage, reducing its output current to very small levels. This will cause transistors M3 and M4 to lose control of the common mode output level at the output of the first stage, and second stage devices M5 and M6 will be below threshold. This lifts the output voltage close to the positive rail. If the feedback around the opamp is resistive, with no other bias source ensuring proper input terminal common mode biasing, then the input terminals will have their high levels latched, and the opamp will be in a stable but virtually useless state.

In general, this troublesome behavior is caused by the conflict between two common mode feedback loops, one being the intended one through the differential pair of transistors M7 and M8 to accurately control the output level, and the other the path through the overall feedback resistors through the input pair of transistors M1 and M2. Usually the high drain resistance of tail source transistor M13 degenerates the second feedback path, leaving only the intended one to act in the circuit. But if the input voltage is high enough to send transistor M13 into the ohmic region, its drain resistance falls markedly, increasing the common mode gain through the opamp signal path. Since for a two stage amplifier the common mode gain is positive, this path may take over and latch the opamp state.

Prior art designs have addressed this problem by including two additional devices M15 and M16 as shown in FIG. 2. An appropriate bias voltage is applied to terminal BIAS such that in normal operation, with the input terminals at their desired common mode level, transistors M15 and M16 will be held subthreshold by the tail voltage at the sources of transistors M1 and M2. The common mode feedback loop operated normally, and transistors M15 and M16 do not contribute any noise into the opamp. However, if the input levels ever rise toward the positive rail, transistors M15 and M16 will conduct, maintaining bias current to transistors M3 and M4, and ensuring that the common mode loop will not lose control and latch.

This simple arrangement unfortunately becomes unusable at very low supply voltages. Generally, the lower supply limit for an opamp of this topology will be determined by the supply voltage where tail current transistor M13 goes into the ohmic region at the prescribed input common mode level. Therefore, operating the opamp at the minimum supply voltage means that there is no value of the BIAS voltage in FIG. 2 which will leave transistors M15 and M16 off, and not degrading performance, yet enabling transistors M15 and M16 to catch the condition that transistor M13 is entering the ohmic region.

SUMMARY OF THE INVENTION

An opamp with common mode feedback bias includes: a first differential pair having first and second inputs; active load devices coupled to the first differential pair; a common mode feedback circuit coupled to the active load devices for controlling the active load devices; a second differential pair having a first input coupled to the first input of the first differential pair and a second input coupled to the second input of the first differential pair; and current drivers having control nodes coupled to the second differential pair and outputs coupled to the active load devices.

DETAILED DESCRIPTION OF PREFERRED EMBODIMENTS

Figure 3:
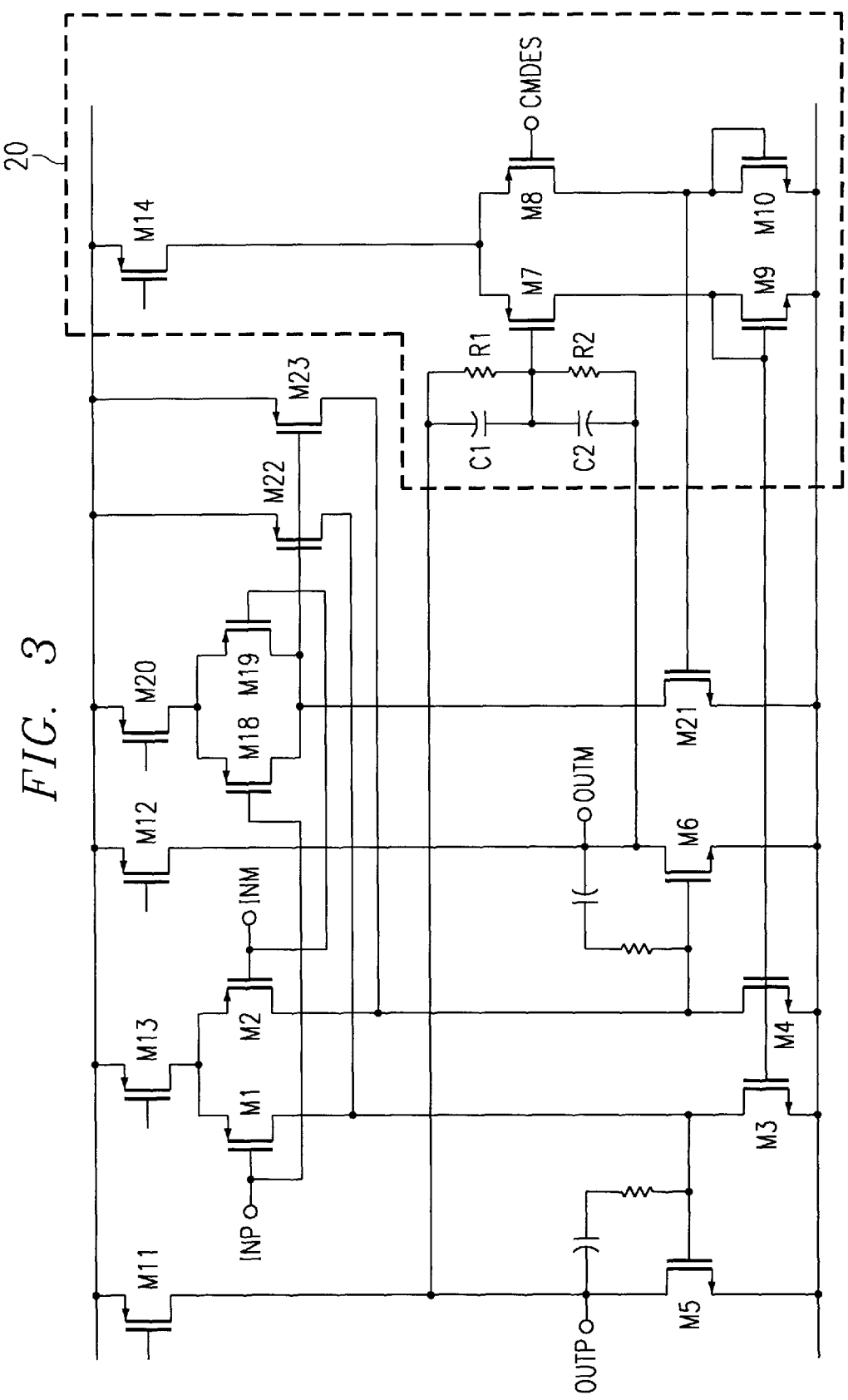
FIG. 3 is a schematic circuit diagram of a preferred embodiment opamp with common mode feedback bias.

A preferred embodiment opamp with common mode feedback bias is shown in FIG. 3. In this opamp a small scale replica of the input stage is fashioned with transistors M18 and M19, and tail source transistor M20. If these devices are scaled versions of the actual input differential pair devices, then transistor M20 will go into the ohmic region at the same input common mode level that sends transistor M13 into its ohmic region. Transistor M21 is arranged to have a small bias current flowing through it. It is a long, thin device, and its gate must be biased a little above threshold. Load device M10 of the common mode feedback circuit 20, which should be included to fully balance the loads to common mode feedback amplifier transistors M7 and M8, provides a convenient source of such a voltage. Under normal operation, with enough gate bias being applied to transistors M18 and M19 from the input terminals INP and INM, the small bias current from transistor M21 will not be sufficient to keep transistors M18, M19 and M20 in their saturation regions, and devices M22 and M23 will be below threshold. Thus, they will not contribute noise or otherwise degrade the opamp function. However, if the opamp input level rises to the point where the tail current available from transistor M20 is markedly reduced, then the voltage at the gates of transistors M22 and M23 will lower, driving current into the load devices M3 and M4, properly biasing them to maintain operation of the common mode feedback loop.

Figure 1:
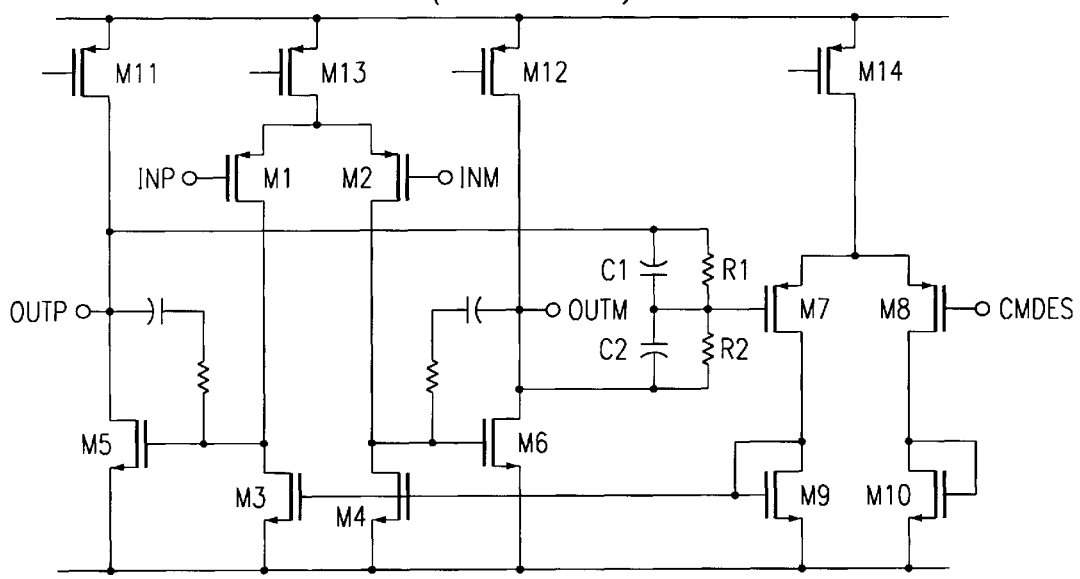
FIG. 1 is a schematic circuit diagram of a prior art two stage fully differential opamp with common mode feedback.
Figure 4:
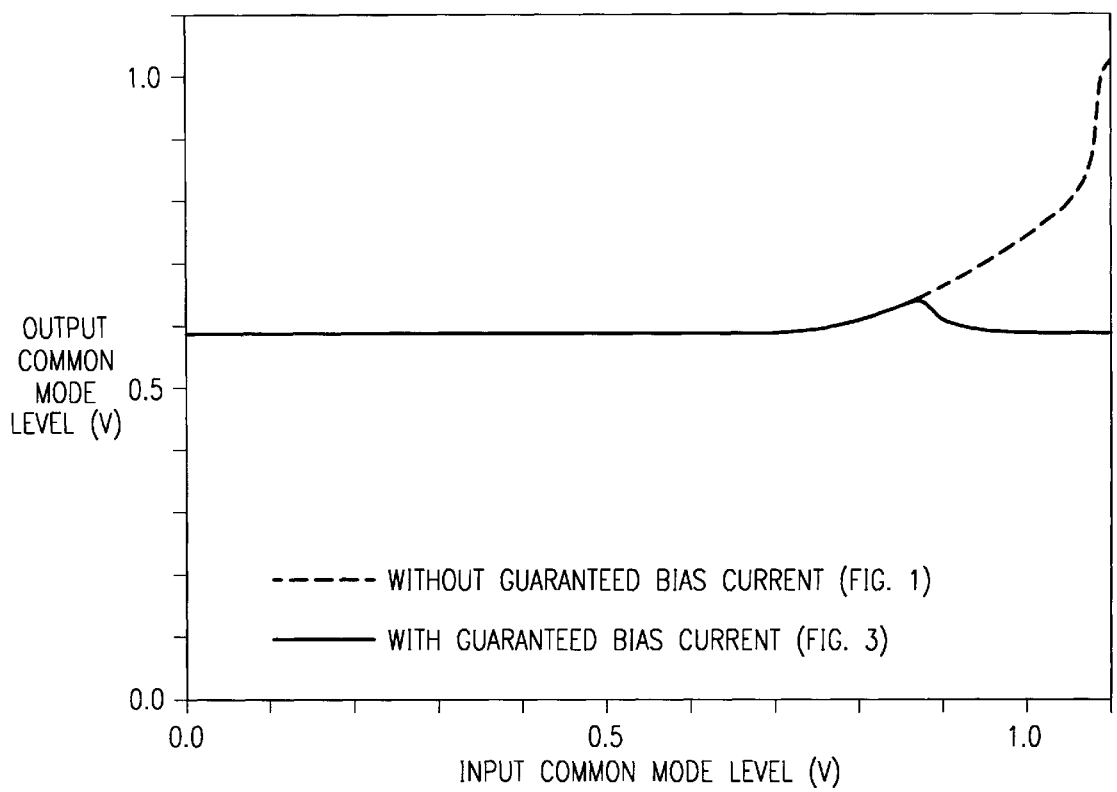
FIG. 4 is a graph comparing the common mode feedback loop performance of the circuits of FIGS. 1 and 3.

FIG. 4 illustrates the effectiveness of the referred 30 embodiment circuit of FIG. 3. In FIG. 4, the common mode output level of the opamps of FIGS. 1 and 3 are plotted against the common mode input terminal level. The supply voltage for the opamps is 1.1 volt, and the desired common mode output level is set at 0.6 volt.

As can be clearly seen following the dashed plot line in FIG. 4, without the circuitry of FIG. 3 the common mode feedback loop is disabled with input common mode levels approaching the positive rail. This would result in a self-consistent latched condition as the output common mode drifts up to the supply. The solid line represents the improved behavior of the circuit of FIG. 3, where the common mode loop is in operation irrespective of the input level, precluding a latched condition.

Figure 2:
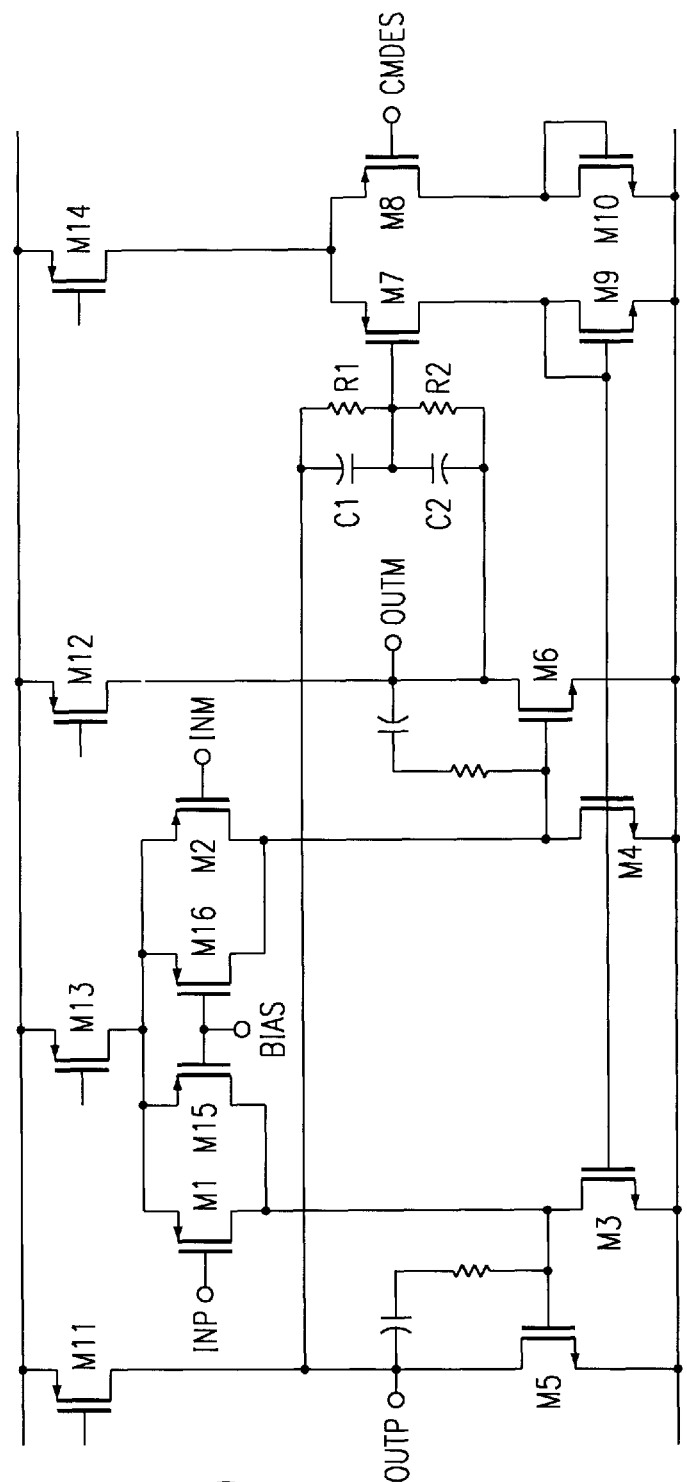
FIG. 2 is a schematic circuit diagram of a prior art two stage fully differential opamp with common mode feedback with guaranteed bias current.

The extra circuitry of transistors M18–M23 in FIG. 3 is somewhat more complex than the simple addition of two devices in FIG. 2, but the simple solution of FIG. 2 will not work in low voltage opamps, and the current and area required for the extra six devices is quite small relative to what is generally needed for transistors M1 and M2 in a low noise amplifier.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
    a first differential pair having first and second inputs;
    active load devices coupled to the first differential pair;
    a common mode feedback circuit coupled to the active load devices for controlling the active load devices;
    a second differential pair having a first input coupled to the first input of the first differential pair and a second input coupled to the second input of the first differential pair; and
    current drivers having control nodes coupled to the second differential pair and outputs coupled to the active load devices.

2. The circuit of claim 1 further comprising:
    a first tail current source coupled to the first differential pair; and
    a second tail current source coupled to the second differential pair.

3. The circuit of claim 1 further comprising:
    a first common source amplifier coupled to a first branch of the first differential pair; and
    a second common source amplifier coupled to a second branch of the first differential pair.

4. The circuit of claim 3 further comprising:
    a first input of the common mode feedback circuit coupled to the first common source amplifier; and
    a second input of the common mode feedback circuit coupled to the second common source amplifier.

5. The circuit of claim 2 further comprising a bias current source coupled to the second differential pair.

6. The circuit of claim 1 wherein the active load devices comprise:
    a first transistor coupled to a first branch of the first differential pair; and
    a second transistor coupled to a second branch of the first differential pair.

7. The circuit of claim 6 further comprising:
    a third transistor having a control node coupled to the first branch of the first differential pair; and
    a fourth transistor having a control node coupled to the second branch of the first differential pair.

8. The circuit of claim 7 wherein the common mode feedback circuit comprises:
    a third differential pair having first and second input nodes;
    a first resistor coupled between the third transistor and the first input node;
    a second resistor coupled between the fourth transistor and the first input node; and
    a common mode reference voltage node coupled to the second input node.

9. The circuit of claim 8 further comprising:
    a first capacitor coupled in parallel with the first resistor; and
    a second capacitor coupled in parallel with the second resistor.

10. The circuit of claim 7 further comprising:
    a first active load transistor coupled to the third transistor; and
    a second active load transistor coupled to the fourth transistor.

11. The circuit of claim 8 further comprising a fifth transistor coupled to a first branch of the third differential pair, a control node of the first transistor is coupled to the first branch of the third differential pair and to a control node of the fifth transistor, a control node of the second transistor is coupled to the control node of the first transistor.

12. A circuit comprising:
    a first differential pair having first and second inputs;
    active load devices coupled to the first differential pair;
    a common mode feedback circuit coupled to the active load devices for controlling the active load devices;
    a second differential pair having a first input coupled to the first input of the first differential pair and a second input coupled to the second input of the first differential pair;
    current drivers having control nodes coupled to the second differential pair and outputs coupled to the active load devices; and
    a class A output stage coupled to the first differential pair and coupled to an input of the common mode feedback circuit.

13. The circuit of claim 12 further comprising:
    a first tail current source coupled to the first differential pair; and
    a second tail current source coupled to the second differential pair.

14. The circuit of claim 12 further comprising a bias current source coupled to the second differential pair.

15. The circuit of claim 12 wherein the active load devices comprise:

a first transistor coupled to a first branch of the first differential pair; and a second transistor coupled to a second branch of the first differential pair.

16. The circuit of claim 12 wherein the class A output stage comprises.

a first common source amplifier coupled to a first branch of the first differential pair; and a second common source amplifier coupled to a second branch of the first differential pair.

17. The circuit of claim 16 wherein the common mode feedback circuit comprises:

a third differential pair having first and second input nodes;

a first resistor coupled between the first common source amplifier and the first input node;

a second resistor coupled between the second common source amplifier and the first input node; and a common mode reference voltage node coupled to the second input node.

18. The circuit of claim 17 further comprising:

a first capacitor coupled in parallel with the first resistor; and a second capacitor coupled in parallel with the second resistor.

19. The circuit of claim 17 further comprising:

a first transistor coupled to a first branch of the third differential pair and coupled to a control node of the active load devices;

a second transistor coupled to a second branch of the third differential pair; and a third transistor coupled to the second differential pair and having a control node coupled to the second branch of the third differential pair.

* * * * *